United States Patent [19]

Takahashi et al.

[11] Patent Number: 4,976,245
[45] Date of Patent: Dec. 11, 1990

[54] UNIT INJECTOR

[75] Inventors: Takeshi Takahashi; Toshiro Itatsu, both of Mishima, Japan

[73] Assignee: Toyota Jidosha Kabushiki Kaisha, Toyota, Japan

[21] Appl. No.: 405,882

[22] Filed: Sep. 11, 1989

[30] Foreign Application Priority Data

Sep. 21, 1988 [JP] Japan .................................. 63-234823

[51] Int. Cl.$^5$ ...................... F02M 39/00; F02M 47/00
[52] U.S. Cl. .................................... 123/506; 123/501; 123/495; 239/124
[58] Field of Search ............... 123/506, 498, 495, 500, 123/501, 447; 417/283, 284, 541, 423.11; 239/124, 125, 88-91, 93-96, 533.5, 533.9

[56] References Cited

U.S. PATENT DOCUMENTS

| | | | |
|---|---|---|---|
| 2,595,639 | 5/1952 | Chmura | 239/124 |
| 4,129,253 | 12/1978 | Bader | 239/124 |
| 4,280,659 | 7/1981 | Gaal | 239/124 |
| 4,410,138 | 10/1983 | Peters | 239/125 |
| 4,448,169 | 5/1984 | Badgley | 123/501 |
| 4,462,368 | 7/1984 | Funada | 123/501 |
| 4,527,737 | 7/1985 | Deckard | 239/124 |
| 4,618,095 | 10/1986 | Spoolstra | 239/124 |
| 4,674,461 | 6/1987 | Hiyama | 123/500 |
| 4,697,565 | 10/1987 | Kobayashi et al. | |

FOREIGN PATENT DOCUMENTS 63-65167 3/1988 Japan .
63-113176 5/1988 Japan .

Primary Examiner—Carl Stuart Miller

[57] ABSTRACT

A unit injector comprising a plunger, a high pressure fuel chamber defined by the tip face of plunger, and a fuel supply port open to the high pressure fuel chamber when the plunger is at the fuel compressing operation start position. A variable volume chamber filled with fuel is provided, and the volume of the variable volume chamber is controlled by a piezoelectric element. A spill valve is also provided for spilling out the fuel in the high pressure fuel chamber to stop the fuel injection, and is controlled by the fuel pressure in the variable volume chamber. A fuel charging port connected to the variable volume chamber is open to the plunger bore at a position remote from the tip face of the plunger on a side opposite to the high pressure fuel chamber, and the variable volume chamber is charged with fuel via the fuel charging port. A fuel trapping chamber is formed between the plunger and the plunger bore at a position between the fuel supply port and the fuel charging port to trap fuel leaked from the high pressure fuel chamber.

21 Claims, 9 Drawing Sheets 4,976,245

UNIT INJECTOR

BACKGROUND OF THE INVENTION

1. Field of the Invention

The present invention related to a unit injector.

2. Description of the Related Art

The present applicant has proposed a unit injector comprising a plunger driven by an engine, a high pressure fuel chamber filled with fuel which is pressurized by the plunger, a fuel supply port open to the high pressure fuel chamber when the plunger is at the compressing operation start position, and closed by the plunger when the fuel compressing action by the plunger is started, a needle moved in accordance with the fuel pressure in the high pressure fuel chamber to open a valve opening when the fuel pressure exceeds a predetermined pressure, a variable volume chamber filled with fuel and having a volume which is changed by an actuator, a spill valve controlling the spillage of fuel in the high pressure fuel chamber in response to the fuel pressure in the variable volume chamber, a fuel charging port formed on the inner circumferential wall of a plunger bore and in communication with the variable volume chamber, and a fuel charging bore formed in the plunger. One end of the fuel charging bore is open at the outer circumferential wall of the plunger, and the other end of the fuel charging bore is open to the high pressure fuel chamber. When the plunger is at the fuel compressing operation start position, the fuel charging port is connected to the fuel charging bore, and while the fuel compressing action by the plunger is carried out the fuel charging port is closed by the plunger (Japanese Utility Model Application No. 63-1707).

In this unit injector, since the fuel charging port is connected to the fuel charging bore when the plunger is at the fuel compressing operation start position, the fuel in the high pressure fuel chamber is fed into the variable volume chamber via the fuel charging bore and the fuel charging port, whereby the variable volume chamber is charged with fuel. Then, while the fuel compressing action by the plunger is carried out, the fuel charging port is closed by the plunger.

However, when the fuel in the high pressure fuel chamber is pressurized and thus reaches a high pressure, a part of the fuel under high pressure leaks through the clearance between the plunger and the plunger bore. At this time, even if the fuel charging port is closed by the plunger, the thus leaked fuel under high pressure flows into the fuel charging port, and as a result, since the pressure of fuel is the variable volume chamber becomes high, the spill valve is actuated although the actuator is not operated, this result in a problem in that it becomes impossible to properly control the fuel injection by the actuator.

SUMMARY OF THE INVENTION

An object of the present invention is to provide a unit injector capable of precisely controlling the spill valve by the actuator.

According to the present invention, there is provided a unit injector of an engine, comprising: a housing having a plunger bore and a nozzle opening; a plunger reciprocally movable in the plunger bore and driven by the engine; a high pressure fuel chamber formed in the housing and defined by a tip face of the plunger, the pressure of fuel in the high pressure fuel chamber being increased by the plunger; a fuel supply port open to the high pressure fuel chamber to feed fuel into the high pressure fuel chamber when the plunger is at a fuel compressing operation start position, the fuel supply port being closed by the plunger when a fuel compressing operation in the high pressure fuel chamber by the plunger is started; a needle arranged in the housing and opening the nozzle opening to inject the fuel in the high pressure fuel chamber from the nozzle opening when the pressure of fuel in the high pressure fuel chamber is higher than a predetermined pressure; an actuator having a variable volume chamber filled with fuel; a spill valve actuated in response to a change in the pressure of fuel in the variable volume chamber to spill out the fuel in the high pressure fuel chamber when the fuel injection is to be stopped; a fuel source having a pressure which is higher than the atmospheric pressure; a fuel charging port communicating with the variable volume chamber and formed on an inner circumferential wall of the plunger bore at a position spaced from the tip face of the plunger on a side opposite to the high pressure fuel chamber, the plunger controlling a fluid communication between the fuel source and the fuel charging port to connect the fuel charge port to the fuel source when the plunger is at the fuel compressing operation start position and to disconnect the fuel charging port from the fuel source while the fuel compressing operation by the plunger is carried out; and a fuel trapping chamber formed between the plunger and the plunger bore at a position between the fuel supply port and the fuel charging port to trap fuel which has leaked from the high pressure fuel chamber through a clearance between the plunger and the plunger bore.

The present invention may be more fully understood from the description of preferred embodiments of the invention set forth below, together with the accompanying drawings.

DESCRIPTION OF THE PREFERRED EMBODIMENTS

Figure 1:
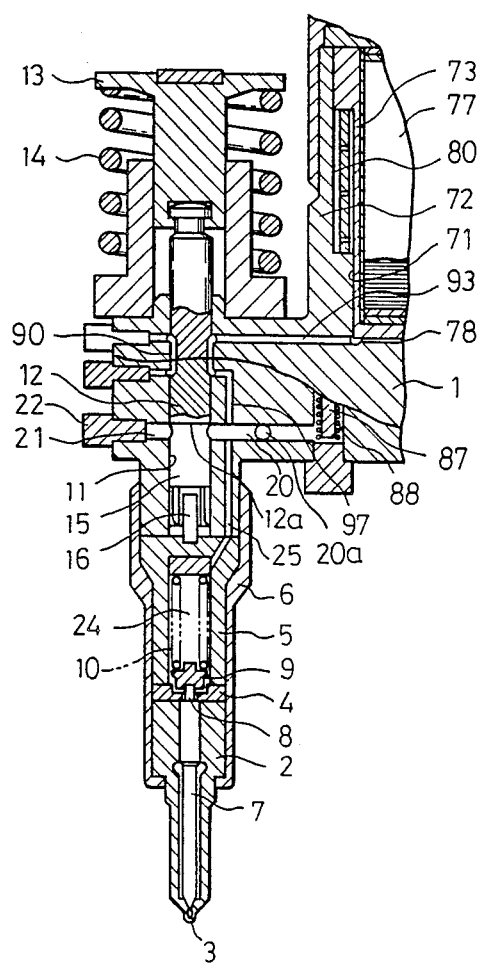
FIG. 1 is a cross-sectional side view of a unit injector illustrating the lower half thereof taken along the line IA—IA in FIGS. 4 and 9 and illustrating the upper half thereof taken along the line IB—IB in FIG. 9.

FIGS. 1 through 9 illustrate a first embodiment of a unit injector.

Referring to FIGS. 1 through 6, reference numeral 1 designates a housing body, 2 a nozzle having a nozzle opening 3 at the top portion thereof, 4 a spacer, 5 a sleeve, and 6 a nozzle holder for mounting the nozzle 2, spacer 4, and sleeve 5 to the housing body 1. A needle 7 is slidably inserted in the nozzle 2 and opens and closes the nozzle opening 3. The top of the needle 7 is connected to a spring retainer 9 via a pressure pin 8. The spring retainer 9 is biased downward by a compression spring 10 and this bias force is communicated to the needle 7 through the pressure pin 8. Therefore, the needle 7 is biased in the closed direction by the compression spring 10.

Figure 3:
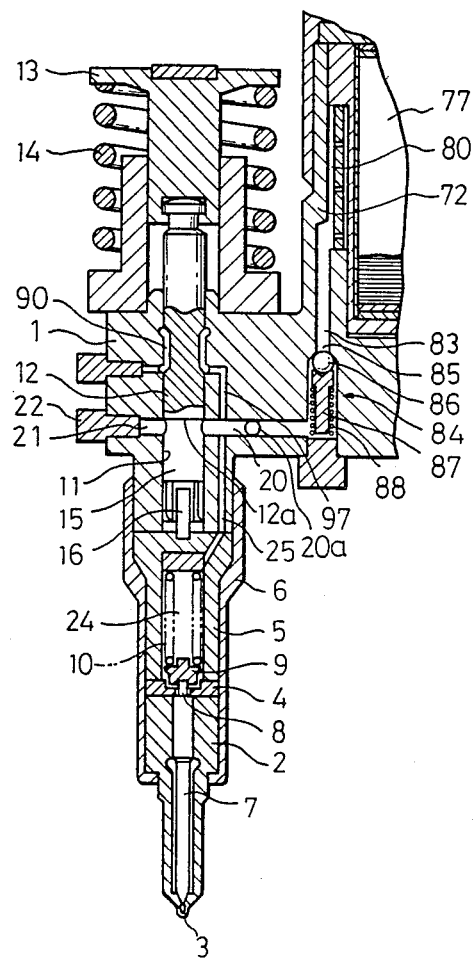
FIG. 3 is a cross-sectional side view of the unit injector, taken along the line IA—IA in FIGS. 4 and 9.
Figure 4:
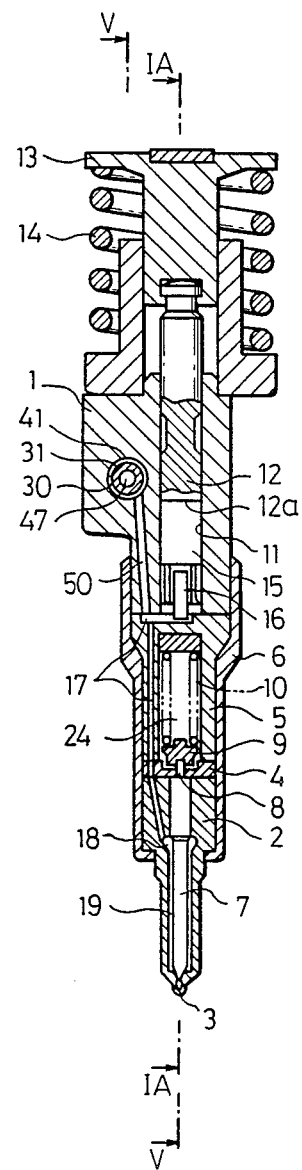
FIG. 4 is a cross-sectional side view of the unit injector, taken along the line IV—IV in FIG. 5.

On the other hand, a plunger bore 11 is formed in the housing body 1 coaxially with the needle 7, and a plunger 12 is slidably inserted in this plunger bore 11. The top end of the plunger 12 is connected to a tappet 13, which is biased upward by a compression spring 14. This tappet 13 is moved up and down by an engine driven cam (not shown) and thus the plunger 12 is moved up and down in the plunger bore 11. On the other hand, a high pressure fuel chamber 15 defined by the lower end face 12a of the plunger 12 is formed in the plunger bore 11 under the plunger 12. This high pressure fuel chamber 15 is connected to a pressurized fuel reservoir 18 via a rod filter 16 and a fuel passage 17 (FIG. 4). The pressurized fuel reservoir 18 is connected to the nozzle opening 3 through an annular fuel passage 19 around the needle 7. Further, a fuel supply port 20 is formed in the inner wall of the plunger bore 11 and is open to the high pressure fuel chamber 15 when the plunger 12 is at the fuel compressing operation start position, as shown in FIGS. 1 and 3. Fuel having a feed pressure of about 2–3 kg/cm$^2$ is supplied from the fuel supply port 20 to the high pressure fuel chamber 15. The fuel supply port 20 is connected to, for example, a fuel tank (not shown) via a fuel discharge passage 20a extending perpendicular from the fuel supply port 20 and via a relief valve (not shown) which is opened when the pressure is higher than about 2–3 kg/cm$^2$.

As illustrated in FIGS. 1 and 3, a fuel port 21, formed when the boring operation of the fuel supply port 20 is carried out, is formed on the side opposite to the fuel supply port 20 with respect to the plunger bore 11, and the outer end portion of the fuel port 21 is closed by a blind plug 22. A compression spring receiving chamber 24 receiving therein the compression spring 10 used for biasing the needle 7 is connected to the fuel supply port 20 via a fuel return passage 25, and the fuel which has leaked into the compression spring receiving chamber 24 is returned to the fuel supply port 20 via the fuel return passage 25.

Figure 5:
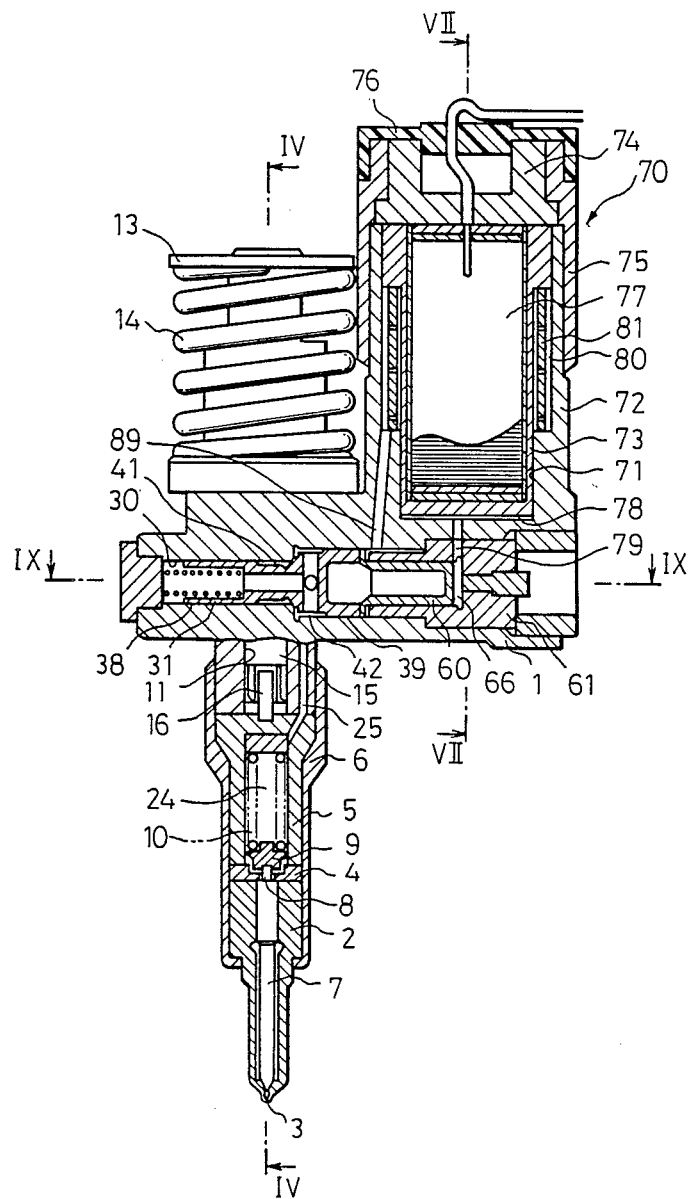
FIG. 5 is a cross-sectional side view of the unit injector, taken along the line V—V is FIG. 4.
Figure 6:
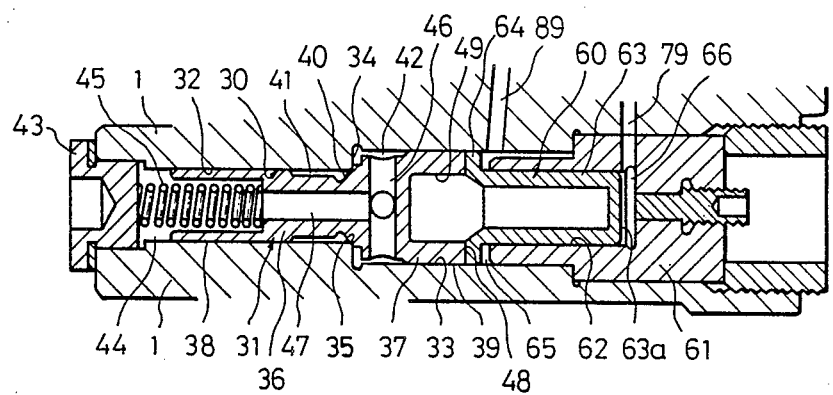
FIG. 6 is an enlarged cross-sectional side view of a portion of the unit injector illustrated in FIG. 5.

On the other hand, a bore 30 is formed in the housing body 1 and extended in the horizontal plane near the plunger bore 11. Namely, the bore 30 is formed so that the axis thereof is parallel to and spaced from a line which is substantially at a right angle to a common axis of the plunger 12 and needle 7. A spill valve 31 is slidably inserted in the bore 30. As illustrated in FIGS. 5 and 6, the bore 30 comprises a reduced diameter bore portion 32 and an increased diameter bore portion 33 which are coaxially arranged, and a step portion 34 extending perpendicular to the common axis of the reduced diameter bore portion 32 and the increased diameter bore portion 33 is formed between the reduced diameter bore portion 32 and the increased diameter bore portion 33. An annular valve seat 35 is formed at the connecting portion of the step portion 34 and the reduced diameter bore portion 32.

The spill valve 31 comprises a reduced diameter portion 36 located in the reduced diameter bore portion 32, and an increased diameter portion 37 located in the increased diameter bore portion 33. A first annular fitting portion 38, which is in tight contact with the inner wall of the reduced diameter bore portion 32, is formed at the outer end of the reduced diameter portion 36, and a second annular fitting portion 39, which is in tight contact with the inner wall of the increased diameter bore portion 33, is formed at the outer end of the increased diameter bore portion 37. An annular valve portion 40, which can be seated on the valve seat 35, is formed on the outer circumferential wall of the spill valve 31 between the first annular fitting portion 38 and the second annular fitting portion 39. An annular high pressure fuel introduction chamber 41 is formed around the outer circumferential wall of the spill valve 31 between the annular valve portion 40 and the first annular fitting portion 38, and an annular fuel spill chamber 42 is formed around the outer circumferential wall of the spill valve 31 between the annular valve portion 40 and the second annular fitting portion 39.

As illustrated in FIG. 6, a portion of the outer circumferential wall of the increased diameter portion 37, which portion defines the fuel spill chamber 42, has a larger diameter than that of the reduced diameter bore portion 32, and thus the fuel spill chamber 42 has a relatively small volume. The outer end portion of the reduced diameter portion 32 is closed by a blind plug 43, and a spill valve back pressure chamber 44 is formed between the blind plug 43 and the spill valve 31. A compression spring 45 is inserted in the spill valve back pressure chamber 44 to bias the spill valve 31 in a direction in which the annular valve portion 40 of the spill valve 31 moves away from the valve seat 35, i.e., to bias the spill valve 31 in the open direction. A radially extended fuel passage 46 which is open to the fuel spill chamber 42 is formed in the increased diameter portion 37 of the spill valve 31, and an axially extended fuel passage 47 which is open to the spill valve back pressure chamber 44 is formed in the reduced diameter portion 36 of the spill valve 31. These fuel passages 46 and 47 are interconnected within the spill valve 31, and thus the spill valve back pressure chamber 44 is connected to the fuel spill chamber 42 via both the fuel passages 46 and 47. A recess 49, which extends to the vicinity of the fuel passage 46, is formed on the central portion of the end face 48 of the spill valve 31, which end face 48 is located on the second annular fitting portion side. As mentioned above, since the recess 49 and the fuel passages 46, 47 are formed in the spill valve 31, the mass of the spill valve 31 is considerably reduced.

Figure 9:
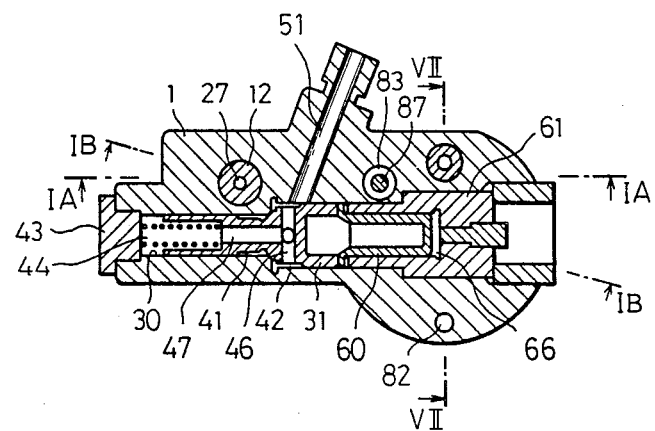
FIG. 9 is a cross-sectional plan view of the unit injector, taken along the line IX—IX in FIG. 5.

As illustrated in FIG. 4, a fuel spill passage 50 extending upward from the fuel passage 17 and continuously open to the high pressure fuel introduction chamber 41 is formed in the housing body 1. This fuel spill passage 50 is continuously connected to the high pressure fuel chamber 15, and thus the high pressure fuel introduction chamber 41 is continuously connected to the high pressure fuel chamber 15. In addition, as illustrated in FIG. 9, the fuel spill chamber 42 is connected to a fuel discharge passage 51, and fuel discharged from the fuel discharge passage 51 is returned, for example, to a fuel tank (not shown).

As illustrated in FIGS. 5 and 6, a rod guide 61 having a rod bore 62 therein for supporting and guiding a rod 60, is fitted into the outer end of the increased diameter bore portion 33 of the bore 20. The rod 60 comprises a hollow cylindrical reduced diameter portion 63 slidably inserted into the rod bore 62, and an increased diameter portion 64 slidably inserted into the increased diameter bore portion 33, and the end face of the increased diameter portion 64 is caused to abut against the end face 48 of the spill valve 31. A rod back pressure chamber 65 is formed between the inner end of the rod guide 61 and the increased diameter portion 64 of the rod 60, and a pressure control chamber 66 defined by the end face 63a of the reduced diameter portion 63 is formed at the end portion of the rod 60, which is located opposite to the increased diameter portion 64. An actuator 70 is arranged above the pressure control chamber 66.

As can be seen from FIGS. 5 and 6, the rod 60 has a hollow cylindrical shape, and thus the mass of the rod 60 is considerably reduced.

Figure 7:
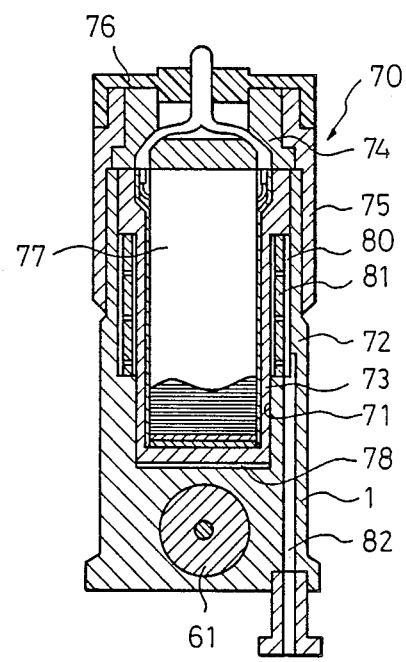
FIG. 7 is a cross-sectional side view of the unit injector, taken along the line VII—VII in FIGS. 5 and 9.
Figure 8:
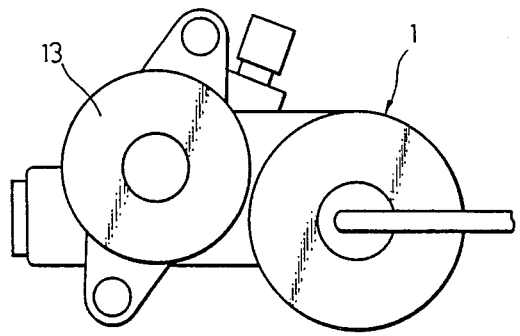
FIG. 8 is a plan view of the unit injector illustrated in FIG. 5.

As illustrated in FIGS. 5 and 7, the actuator 70 compresses an actuator housing 72 integrally formed with the housing body 1 and forming a piston bore 71 therein, a piston 73 slidably inserted into the piston bore 71, an end plate 74 covering the top portion of the actuator housing 72, an end plate holder 75 for fixing the end plate 74 to the top portion of the actuator housing 72, and a cap 76 covering the upper end portion of the end plate 74 and made of a plastic. A piezoelectric element 77 made of a plurality of stacked piezoelectric element plates is inserted between the piston 73 and the end plate 74, and a variable volume chamber 78 defined by the lower end face of the piston 73 is formed in the piston bore 71 beneath the piston 73 and is connected to the pressure control chamber 66 via a fuel passage 79. An annular cooling chamber 80 is formed between the piston 73 and the actuator housing 72, and a compression spring 81 is inserted into the cooling chamber 80 to bias the piston 73 upward. Accordingly, when a charge is applied to the piezoelectric element 77, the piezoelectric element 77 expands axially, and as a result, the volume of the variable volume chamber 78 is reduced, and when the charge of the piezoelectric element 32 is discharged, the piezoelectric element 32 is axially contracted, and as a result, the volume of the variable volume chamber 78 is increased.

As illustrated in FIG. 7, the lower end portion of the cooling chamber 80 is connected, for example, to a low pressure fuel pump (not shown) via a fuel inflow passage 82, and fuel having a low pressure of 2-3 kg/cm$^2$ is supplied to the cooling chamber 80 from the fuel inflow passage 82. The piezoelectric element 77 is cooled by this fuel. In addition, as illustrated in FIG. 3, the lower end portion of the cooling chamber 80 is connected to the fuel supply port 20 via a fuel outflow passage 83, and a check valve 84 permitting only the flow of fuel from the cooling chamber 80 toward the fuel supply port 20 is arranged in the fuel outflow passage 83. This check valve 84 comprises a ball 86 for opening and closing a valve port 85, a rod 87 for restricting the amount of lift of the ball 86, and a compression spring 88 for biasing the ball 86 and the rod 87 upward. Fuel in the cooling chamber 80 is fed into the fuel supply passage 20 via the fuel outflow passage 83, after cooling the piezoelectric element 77. Furthermore, as illustrated in FIGS. 5 and 6, the lower end portion of the cooling chamber 80 is connected to the rod back pressure chamber 65 via a fuel passage 89, and thus in this embodiment the rod back pressure chamber 65 is filled with fuel having a pressure of 2-3 kg/cm$^2$.

Figure 2:
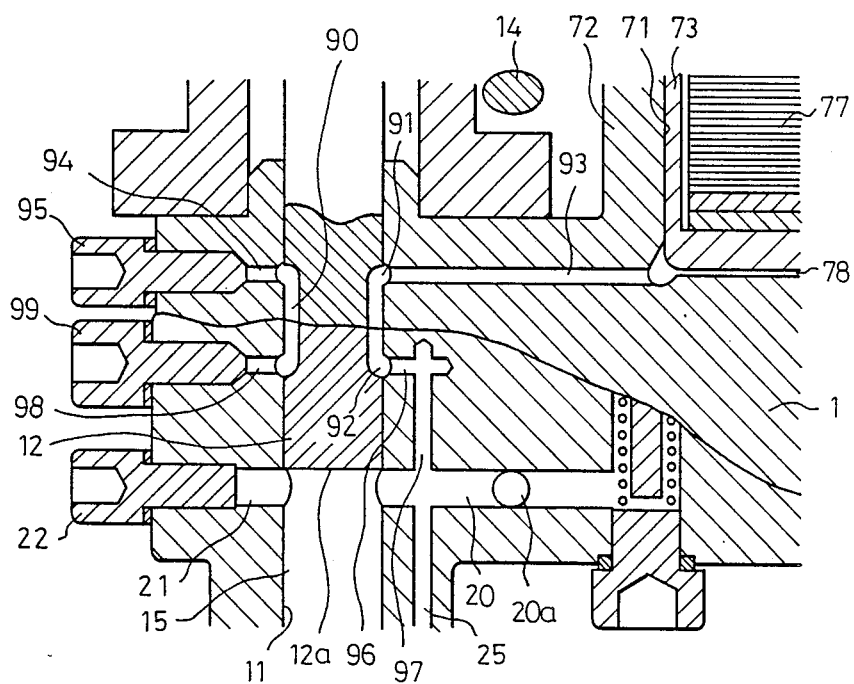
FIG. 2 is an enlarged cross-sectional side view of a portion of the unit injector illustrated in FIG. 1.

As illustrated in FIGS. 1 through 3, a circumferential groove 90 is formed on the outer circumferential wall of the plunger 12. This circumferential groove 90 has an axial width which is slightly smaller than or almost the same as the stroke of the plunger 12, and extends over the entire length of the outer circumferential wall of the plunger 12. In addition, a circumferential groove 91 extending over the entire length of the inner circumferential wall of the plunger bore 11 is formed on the inner circumferential wall of the plunger bore 11 around the upper and portion of the circumferential groove 90 of the plunger 12 which is at the fuel compressing operation start position as illustrated in FIG. 2, and a circumferential groove 92 extending over the entire length of the inner circumferential wall of the plunger bore 11 is formed on the inner circumferential wall of the plunger bore 11 around the lower end portion of circumferential groove 90 of the plunger 12 which is at the fuel compressing operation start position as illustrated in FIG. 2. The circumferential groove 91 forms a fuel charging port which is open at the inner circumferential wall of the plunger bore 11, and this fuel charging port 91 is in communication with the variable volume chamber 78 via a fuel charging passage 93 formed in the housing body 1. A fuel passage 94, formed when the boring operation of the fuel charging passage 93 is carried out, is formed on the side opposite to the fuel charging passage 93 with respect to the plunger bore 11, and the outer end portion of the fuel passage 94 is closed by a blind plug 95. The circumferential groove 92 forms a fuel outflow-inflow port which is open at the inner circumferential wall of the plunger bore 11, and this fuel outflow-inflow port 92 is in communication with the fuel supply port 20 via fuel passages 96 and 97. A fuel passage 98, formed when the boring operation of the fuel passage 96 is carried out, is formed on the side opposite to the fuel passage 96 with respect to the plunger bore 11, and the outer end portion of the fuel passage 98 is closed by a blind plug 99. When the plunger 12 is at the fuel compressing operation start position as illustrated in FIG. 2, both the fuel charging port 91 and the fuel outflow-inflow port 92 are in communication with the circumferential groove 90 and thus, at this time, the variable volume chamber 78 is in communication with the fuel supply port 20 via the fuel charging passage 93, the circumferential groove 90 and the fuel passages 96, 97. When the plunger 12 is moved downward, the fuel charging port 91 is closed by the plunger 12, but the fuel outflow-inflow port 92 is still in communication with the circumferential groove 90.

As mentioned above, fuel is supplied to the cooling chamber 80 via the fuel inflow passage 82, and after cooling the piezoelectric element 77, the fuel is fed into the fuel supply port 20 via the fuel outflow passage 83 and the check valve 84. When the plunger 12 is at the compressing operation start position as shown in FIG. 2, fuel is supplied to the high pressure fuel chamber 15 from the fuel supply port 20, and therefore, the pressure in the high pressure fuel chamber 15 is a low pressure of about 2-3 kg/cm$^2$. On the other hand, at this time the piezoelectric element 77 is fully contracted, and thus the volume of the variable volume chamber 78 is at a maximum. In addition when the plunger 12 is at the fuel compressing operation start position as illustrated in FIG. 2, the variable volume chamber 78 is in communication with the fuel supply port 20 via the circumferential groove 90 and the fuel passages 96, 97, as mentioned above, Consequently, at this time, if the fuel pressure in the variable volume chamber 78 is lower than the feed pressure of fuel in the fuel supply port 20, the fuel in the fuel supply port 20 is fed into the variable volume chamber 78 via the fuel passages 96, 97, the circumferential groove 90 and the fuel charging passage 93. Therefore, when the plunger 12 reaches the fuel compressing operation start position, the fuel pressure in the variable volume chamber 78 becomes a fixed pressure of about 2–3 kg/cm$^2$. As mentioned above, when the plunger 12 is at the fuel compressing operation start position, the variable volume chamber 78 is charged with fuel via the circumferential groove 90 and thus, in this case, the circumferential groove 90 functions as a fuel charging passage formed in the plunger 12.

When the fuel pressure in the variable volume chamber 78 reaches a fixed pressure of about 2–3 kg/cm$^2$, the fuel pressure in the pressure control chamber 66 also reaches a fixed pressure of about 2–3 kg/cm$^2$. At this time, the spill valve 31 is moved to the right in FIGS. 5 and 6 by the compression spring 45 and the annular valve portion 40 is moved away from the valve seat 35, i.e., the spill valve 31 is opened. Consequently, low pressure fuel in the high pressure fuel chamber 15 is fed into the fuel spill chamber 42 via the fuel spill passage 50 and the high pressure fuel introduction chamber 41, and the fuel fed into the fuel spill chamber 42 is discharged from the fuel discharge passage 51. Consequently, at this time, the high pressure fuel introduction chamber 41, the fuel spill chamber 42, and the spill valve back pressure chamber 44 are also filled with low pressure fuel having a pressure of 2–3 kg/cm$^2$.

When the plunger 12 is moved downward, the fuel supply port 20 is closed by the plunger 12, but since the spill valve 31 is open, the fuel in the high pressure fuel chamber 15 flows out into the fuel spill chamber 42 via the fuel spill passage 50 and the high pressure fuel introduction chamber 41 of the spill valve 31. Consequently, also at this time, the pressure of fuel in the high pressure fuel chamber 15 is a low pressure of about 2–3 kg/cm$^2$. In addition, when the plunger 12 is moved downward, the fuel charging port 91 is closed by the plunger 12, and thus the fuel charging passage 93 is disconnected from the circumferential groove 90. Therefore, at this time, the variable volume chamber 78, the fuel charging passage 93, and the pressure control chamber 66 form a closed or confined space.

When a charge is given to the piezoelectric element 77 to start the fuel injection, the piezoelectric element 77 expands axially, and as a result, the piston 73 is moved downward, and thus the fuel pressure in the variable volume chamber 78 and the pressure control chamber 66 is rapidly increased. At this time, although the fuel pressure in the fuel charging passage 93 and the fuel charging port 91 is also rapidly increased, since the fuel charging port 91 extends over the entire length of the inner circumferential wall of the plunger bore 11, a uniformly distributed load is imposed on the outer circumferential wall of the plunger 12 over the entire length thereof. Namely, since an outer force does not concentrically act on only a particular part of the outer circumferential wall of the plunger 12, the plunger 12 cannot be forced onto one side of the inner circumferential wall of the plunger bore 11. Therefore, it is possible to prevent eccentric wear or seizure of the plunger 12.

When the fuel pressure in the pressure control chamber 66 is increased, the rod 60 is moved to the left in FIGS. 5 and 6, and therefore, the spill valve 31 is also moved to the left, and as a result, the annular valve portion 40 of the spill valve 31 abuts against the valve seat 35, and thus the spill valve 31 is closed. When the spill valve 31 is closed, the fuel pressure in the high pressure fuel chamber 15 is rapidly increased due to the downward movement of the plunger 12, and when the fuel pressure in the high pressure fuel chamber 15 exceeds a predetermined pressure, for example, 1500 kg/cm$^2$ or more, the needle 7 is opened and fuel is injected from the nozzle opening 3. At this time, a high pressure is also applied to the high pressure fuel introduction chamber 41 of the spill valve 31 through the fuel spill passage 50, but the pressure receiving areas of the two axial end surfaces of the high pressure fuel introduction chamber 41 are equal, and thus a drive force does not act on the spill valve 31.

In addition, when the fuel pressure in the high pressure fuel chamber 15 becomes high, a part of the fuel under high pressure in the high pressure fuel chamber 15 leaks through the clearance between the plunger 12 and the plunger bore 11, and thus the leaked fuel under a high pressure flows upward on the outer circumferential wall of the plunger 12. Nevertheless, since the circumferential groove 90 extending over the entire length of the outer circumferential wall of the plunger 12 is formed on the outer circumferential wall of the plunger 12, the leaked fuel under a high pressure flows into the circumferential groove 90 and is then discharged into the fuel supply port 20 via the fuel passages 96, 97. Consequently, the leaked fuel under a high pressure cannot flow upward beyond the circumferential groove 90, and therefore, flows into the variable volume chamber 78 from the fuel charging port 91. Namely, at this time, the circumferential wall 90 trap the leaked fuel under a high pressure, and thus the circumferential groove 90 forms a leaked fuel trapping chamber.

When the charge of the piezoelectric element 77 is discharged to stop the fuel injection, the piezoelectric element 77 is contracted, and as a result, the piston 73 is moved upward by the compression spring 81, and therefore, the volume of the variable volume chamber 78 becomes large. At this time, the fuel charging port 91 is closed by the plunger 12, and thus the variable volume chamber 78 and the pressure control chamber 66 form a closed or confined space. Consequently, when the volume of the variable volume chamber 78 becomes large, the fuel pressure in the variable volume chamber 78 and the pressure control chamber 66 instantaneously drops. In addition, at this time, since the fuel under a high pressure leaked from the high pressure fuel chamber 15 is trapped by the circumferential groove 90, the leaked fuel under a high pressure cannot flow into the variable volume chamber 78, and thus the fuel pressure in the variable volume chamber 78 and the pressure control chamber 66 always drops. Note that, at this time, even if the entire circumferential groove 90 of the plunger 12 is positioned below the fuel outflow-inflow port 92, the leaked fuel under a high pressure is still trapped by the circumferential groove 90. Consequently, the circumferential groove 90 does not have to be in communication with the fuel outflow-inflow port 92 over the entire stroke of the plunger 12.

As mentioned earlier, the masses of the rod 60 and the spill valve 31 are small, and therefore, when the fuel pressure in the pressure control chamber 66 is reduced, the rod 60 and the spill valve 31 are immediately moved to the right in FIGS. 5 and 6 by the spring force of the compression spring 45, and as a result, the annular valve portion 40 of the spill valve 31 is moved away from the valve seat 35, and thus the spill valve 31 is immediately opened.

When the spill valve 31 is opened, the fuel under a high pressure in the high pressure fuel chamber 15 is spouted into the fuel spill chamber 42 via the fuel spill passage 50 and the high pressure fuel introduction chamber 41 and thus the fuel pressure in the high pressure fuel chamber 15 rapidly drops.

Since the volume of the fuel spill chamber 42 is small, when the fuel under high pressure is spouted into the fuel spill chamber 42 as mentioned above, the fuel pressure in the fuel spill chamber 42 is temporarily very high. As mentioned earlier, since the second annular fitting portion 39 is formed between the fuel spill chamber 42 and the end face 48 of the increased diameter portion 37 of the spill valve 31, the high pressure generated in the fuel spill chamber 42 does not act on the end face 48 of the increased diameter portion 37 of the spill valve 31, and as a result, this high pressure generated in the fuel spill chamber 42 acts on the cross-sectional area remaining after the cross-sectional area of the reduced diameter bore portion 32 is subtracted from the cross-sectional area of the increased diameter bore portion 33, only in a direction wherein the spill valve 31 is opened, and thus the spill valve 31 is urged in the open direction thereof due to the high pressure generated in the fuel spill chamber 42. In addition, when the fuel under high pressure is spouted into the fuel spill chamber 42, a part of this fuel under high pressure is spouted into the spill valve back pressure chamber 44 from the fuel passage 47 via the fuel passage 46 of the spill valve 31. When the fuel under high pressure is spouted from the fuel passage 47 as mentioned above, a force urging the spill valve 31 in the open direction thereof acts on the spill valve 31 due to the reaction force of the spouting operation of the fuel. Furthermore, when the fuel under high pressure is spouted into the spill valve back pressure chamber 44, the fuel pressure in the spill valve back pressure chamber 44 is increased, and as a result, a force urging the spill valve 31 in the open direction thereof acts on the spill valve 31 due to the fuel pressure in the spill valve back pressure chamber 44. As mentioned above, when the spill valve 31 is opened, a force urging the spill valve 31 in the open direction thereof acts on the spill valve 31 due to an increase in the pressure of fuel in the fuel spill chamber 42, the spouting of fuel from the fuel passage 47, and an increase in the pressure of fuel in the spill valve back pressure chamber 44, and as a result, the spill valve 31 is rapidly opened as soon as the annular valve portion 40 thereof is moved away from the valve seat 35, and in addition, once the spill valve 31 is opened, it remains open. Consequently, when the spill valve 31 is opened, the fuel pressure in the high pressure fuel chamber 15 drops continuously and rapidly, and as a result, when the spill valve 31 is opened, the needle 7 is immediately moved down and the injection of fuel is stopped.

Then, the plunger 12 is moved upward and returned to the fuel compressing operation start position, the fuel in the fuel supply port 20 is fed into the variable volume chamber 78 via the circumferential groove 90, and the variable volume chamber 78 is again charged with fuel.

The fuel pressure in the fuel supply port 20 is maintained at a constant value, and therefore, when the piezoelectric element 77 is contracted, the fuel pressure in the variable volume chamber 78 is also maintained at a constant value. Consequently, when the piezoelectric element 77 is expanded, the fuel pressure in the pressure control valve 66 becomes a fixed high pressure, and thus it is possible to obtain a stable opening and closing operation of the spill valve 31.

As mentioned above, although a powerful downward drive force is applied to the plunger 12 so that the fuel pressure of the high pressure fuel chamber 15 is increased to 1500 kg/cm$^2$ or more, the bore 30 is arranged at the side of the plunger 12 and is not deformed, and thus a smooth sliding action of the spill valve 31 is ensured. Further, the bore 30 is extended horizontally at the side of the plunger 12, and therefore, the bore 30 can be located near the high pressure fuel chamber 15. As a result, the length of the fuel spill passage 50 can be shortened and thus the volume of the high pressure fuel chamber 15, which includes the fuel spill passage 50, can be reduced. Therefore, the fuel pressure in the high pressure fuel chamber 15 is easily increased to a high level, and thus the injected fuel is properly atomized. Further, since the volume of the high pressure fuel chamber 15 can be reduced, the fuel pressure in the high pressure fuel chamber 15 is immediately reduced when the spill valve 31 is opened, and thus the fuel injection is immediately stopped. Accordingly, when the spill valve 31 is opened, the fuel injection does not continue under a low pressure, and thus the generation of smoke is suppressed and the engine output and the fuel consumption rate are improved. Moreover, the amount of fuel injection is immediately increased and the fuel injection is immediately stopped by the opening and closing of the spill valve 31, and therefore, a correct pilot injection is made.

Because the bore 30 extends horizontally at the side of the plunger 12, the lateral width of the unit injector can be reduced, and further, by arranging the piezoelectric element 77 so that the axis thereof is substantially at a right angle to the common axis of the bore 30 and rod 60, i.e., substantially at a right angle to the common axis of the plunger 12 and needle 7, the lateral width of the unit injector can be further reduced.

Figure 10:
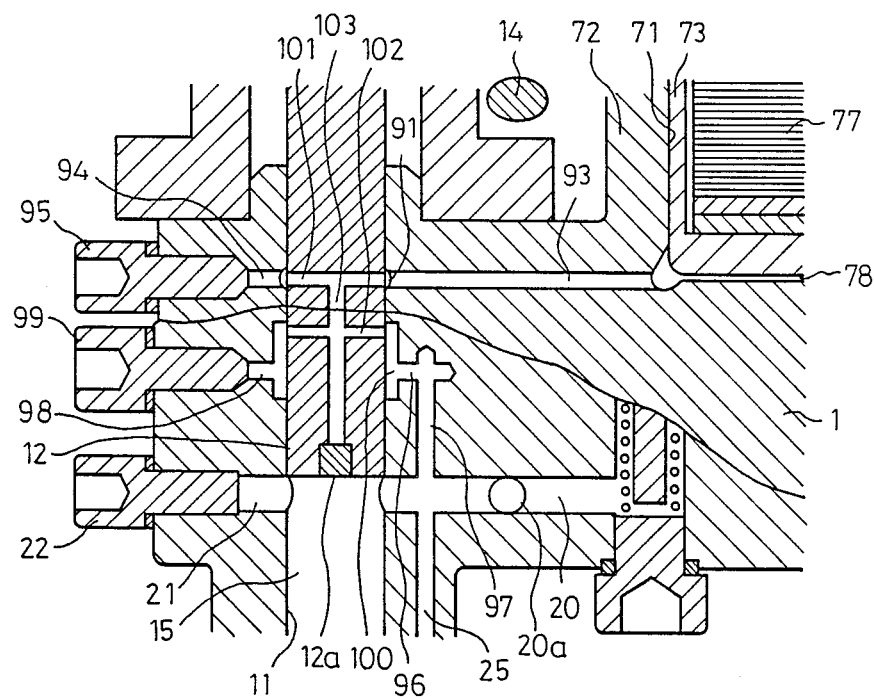
FIG. 10 is a cross-sectional plan view of a second embodiment of a portion of the unit injector.

FIG. 10 illustrates a second embodiment of a unit injector.

In this embodiment, a circumferential groove 100 functioning as both the fuel charging passage and the leaked fuel trapping chamber is formed on the inner circumferential wall of the plunger bore 11. This circumferential groove 100 extends over the entire length of the inner circumferential wall of the plunger bore 11 and is connected to the fuel supply port 20 via the fuel passages 96, 97. The plunger 12 is provided with a first fuel charging passage 101 and a second fuel charging passage 102 which are spaced in the axial direction of the plunger 12 and radially extend therethrough. In addition, the plunger 12 is provided with a fuel charging passage 103 extending in the axial direction thereof and interconnecting the first fuel charging passage 101 to the second fuel charging passage 102. When the plunger 12 is at the fuel compressing operation start position, the first fuel charging passage 101 is in communication with the fuel charging port 91. In the first half of the compression stroke of the plunger 12, the second fuel charging passage 102 is in communication with the circumferential groove 100, and in the second half of the compression stroke of the plunger 12, the first fuel charging passage 101 is in communication with the circumferential groove 100.

Also, in this embodiment, when the plunger 12 is at the fuel compressing operation start position, the fuel in the fuel supply port 20 is fed into the variable volume chamber 78 via the fuel passages 96, 97, the circumferential groove 100, the fuel charging passages 102, 103, 101, the fuel charging port 91, and the fuel charging passage 93, and thus the variable volume chamber 78 is charged with fuel. When the plunger 12 is moved downward, the fuel charging port 91 is closed by the plunger 12, and the fuel under a high pressure leaked from the high pressure fuel chamber 15 is trapped by the circumferential groove 100.

According to the present invention, as mentioned above, since the fuel under a high pressure leaked from the high pressure fuel chamber cannot flow into the variable volume chamber, it is possible to precisely control the spill valve by the actuator.

Although the invention has been described with reference to specific embodiments chosen for purposes of illustration, it should be apparent that numerous modifications could be made thereto by those skilled in the art without departing from the basic concept and scope of the invention.

We claim:

1. A unit injector of an engine, comprising:
   a housing having a plunger bore and a nozzle opening;
   a plunger reciprocally movable in said plunger bore and driven by engine;
   a high pressure fuel chamber formed in said housing and defined by a tip face of said plunger, the pressure of fuel in said high pressure fuel chamber being increased by said plunger;
   a fuel supply port open to said high pressure fuel chamber to feed fuel into said high pressure fuel chamber when said plunger is at a fuel compressing operation start position, said fuel supply port being closed by said plunger when a fuel compressing operation in said high pressure fuel chamber by said plunger is started;
   a needle arranged in said housing and opening said nozzle opening to inject the fuel in said high pressure fuel chamber from said nozzle opening when the pressure of fuel in said high pressure fuel chamber is higher than a predetermined pressure;
   an actuator having a variable volume chamber filled with fuel;
   a spill valve actuated in response to a change in the pressure of fuel in said variable volume chamber to spill out the fuel in said high pressure fuel chamber when the fuel injection is to be stopped;
   a fuel source having a pressure which is higher than the atmospheric pressure;
   a fuel charging port being in communication with said variable volume chamber and formed on an inner circumferential wall of said plunger bore at a position spaced from said tip face of said plunger on a side opposite to said high pressure fuel chamber, said plunger controlling a fluid communication between said fuel source and said fuel charging port to connect said fuel charge port to said fuel source when said plunger is at the fuel compressing operation start position and to disconnect said fuel charging port from said fuel source while the fuel compressing operation by said plunger is carried out; and
   a fuel trapping chamber formed between said plunger and said plunger bore at a position between said fuel supply port and said fuel charging port to trap fuel which is leaked from said high pressure fuel chamber through a clearance between said plunger and said plunger bore.

2. A unit injector according to claim 1, wherein said fuel trapping chamber extends along the entire length of an outer circumferential wall of said plunger.

3. A unit injector according to claim 2, wherein said fuel trapping chamber extends in an axial direction of said plunger.

4. A unit injector according to claim 3, wherein the length of said fuel trapping chamber in the axial direction is smaller than the length of a stroke of said plunger.

5. A unit injector according to claim 3, wherein the length of said fuel trapping chamber in the axial direction is roughly equivalent to a stroke of said plunger.

6. A unit injector according to claim 2, wherein said fuel trapping chamber is formed by a circumferential groove formed on the outer circumferential wall of said plunger.

7. A unit injector according to claim 6, wherein said plunger bore has a fuel outflow circumferential groove formed on the inner circumferential wall thereof and extending over the entire length of the inner circumferential wall thereof, and said fuel outflow circumferential groove is communicatable with said circumferential groove of said plunger to discharge fuel from said circumferential groove of said plunger.

8. A unit injector according to claim 7, wherein said fuel outflow circumferential groove is connected to said fuel supply port.

9. A unit injector according to claim 2, wherein said fuel trapping chamber is formed by a circumferential groove formed on the inner circumferential wall of said plunger bore.

10. A unit injector according to claim 9, wherein said circumferential groove is connected to said fuel supply port.

11. A unit injector according to claim 1, wherein said fuel charge port is formed by a circumferential groove extending over the entire length of the inner circumferential wall of said plunger bore.

12. A unit injector according to claim 1, wherein said fuel trapping chamber is formed on said plunger and is in communication with said fuel charging port to connect said variable volume chamber to said fuel source via said fuel trapping chamber when said plunger is at the fuel compressing operation start position, and said fuel charging port is closed by said plunger while the fuel compressing operation by said plunger is carried out.

13. A unit injector according to claim 12, wherein said plunger bore has a fuel outflow-inflow port formed on the inner circumferential wall thereof between said fuel supply port and said fuel charging port and in communication with said fuel source, and said fuel outflow-inflow port is in communication with said fuel trapper chamber at least when said plunger is at the fuel compressing operation start position.

14. A unit injector according to claim 13, wherein said fuel trapper chamber formed by a circumferential groove formed on the outer circumferential wall of said plunger and extending over the entire length of the outer circumferential wall of said plunger, and said circumferential groove has a first axial end portion nearest to said tip face of said plunger and has a second axial end portion furthest from said tip face of said plunger, and said fuel outflow-inflow port and said fuel charging port are in communication with said first axial end portion and said second axial end portion, respectively, when said plunger is at the fuel compressing operation start position.

15. A unit injector according to claim 13, wherein said fuel source is a fuel in said fuel supply port, and said fuel outflow-inflow port is in communication with said fuel supply port.

16. A unit injector according to claim 13, wherein said fuel outflow-inflow port is formed by a circumferential groove extending over the entire length of the inner circumferential wall of said plunger bore.

17. A unit injector according to claim 1, wherein said fuel trapping chamber is formed on the inner circumferential wall of said plunger bore and is in communication with said fuel source, and said plunger is provided with a fuel charging passage to connect said fuel charge port to said fuel trapper chamber via said fuel charging passage when said plunger is at the fuel compressing operation start position, said fuel charging port being closed by said plunger while the fuel compressing operation by said plunger is carried out.

18. A unit injector according to claim 17, wherein said fuel charging passage comprises a first radially extending bore which is communicatable with said fuel charging port, a second radially extending bore which is communicatable with said fuel trapping chamber, and an axially extending bore interconnecting said first radially extending bore to said second radially extending bore.

19. A unit injector according to claim 18, wherein said fuel trapping chamber is formed by a circumferential groove extending over the entire length of said inner circumferential wall of said plunger bore, and said circumferential groove has an axial end portion furthest from said tip face of said plunger, said second radially extending bore being in communication with said axial end portion when said plunger is at the fuel compressing operation start position.

20. A unit injector according to claim 17, wherein said fuel source is a fuel in said fuel supply port, and said fuel trapping chamber is in communication with said fuel supply port.

21. A unit injector according to claim 1, wherein said actuator comprises a piston defining said variable volume chamber, and a piezoelectric element driving said piston.

* * * * *